United States Patent [19]

White

[11] 4,351,467
[45] Sep. 28, 1982

[54] PIN CHUCK PRESS

[76] Inventor: William P. White, c/o Mechanical Application, Inc., Wiscasset, Me. 04578

[21] Appl. No.: 138,003

[22] Filed: Apr. 7, 1980

[51] Int. Cl.³ .................... H05K 13/04; B33B 49/00
[52] U.S. Cl. ................................. 227/142; 408/14; 227/156
[58] Field of Search ................. 227/51, 116, 142, 156

[56] References Cited

U.S. PATENT DOCUMENTS

| | | | |
|---|---|---|---|
| 3,126,767 | 3/1964 | Sawyer | 408/14 X |
| 3,382,740 | 5/1968 | Lotta | 408/89 X |
| 3,763,540 | 10/1973 | Long, Jr. | 227/116 |
| 3,940,970 | 3/1976 | Terral et al. | 408/90 X |
| 3,982,679 | 9/1976 | White, Jr. | 227/116 |
| 4,115,017 | 9/1978 | Wilhelmsson | 408/14 |
| 4,242,016 | 12/1980 | Faris | 408/14 |

Primary Examiner—Paul A. Bell
Attorney, Agent, or Firm—C. Yardley Chittick

[57] ABSTRACT

A pin chuck press having means for adjusting the rest position of the pin inserting means up or down with respect to a work piece supporting base so that the inserting means will be able to place pins in the cooperating holes in work pieces of different vertical dimensions.

4 Claims, 4 Drawing Figures

PIN CHUCK PRESS

BACKGROUND OF THE INVENTION

Mechanical devices for inserting pins one at a time into cooperating holes in work pieces are now in use in industry. Two such mechanisms are shown in U.S. Pat. Nos. 3,788,537 and 3,982,679. In the use of these devices, it is essential that the work piece and the pin driving means be precisely spaced so that the pin when inserted in the work piece will enter to the exact required depth. Where there are long runs in which one sized pin is inserted into work pieces of uniform vertical dimensions, the need for quick set up time is not present. On the other hand, where there are short runs with the pin receiving pieces being of varying vertical dimensions, the set up time assumes substantial importance in the cost of the operation.

SUMMARY OF THE INVENTION

The present invention contemplates the use of a pin chuck generally of the type disclosed in the drawings of this application and in U.S. Pat. No. 3,788,537 but not limited thereto. The pin chuck is mounted on the piston of a vertically disposed air or hydraulically operated cylinder. The cylinder is rigidly supported on a frame of novel construction which permits the cylinder and chuck to be quickly and easily adjusted to a workable vertical position (within limits) over any work piece resting on an associated base thereunder. This initial relatively coarse adjustment is combined with a second fine adjustment which limits precisely the downward movement of the pin driving punch so that the extent of the entry of the pin into the work piece may be exactly controlled.

DESCRIPTION OF A PREFERRED EMBODIMENT

Figure 1:
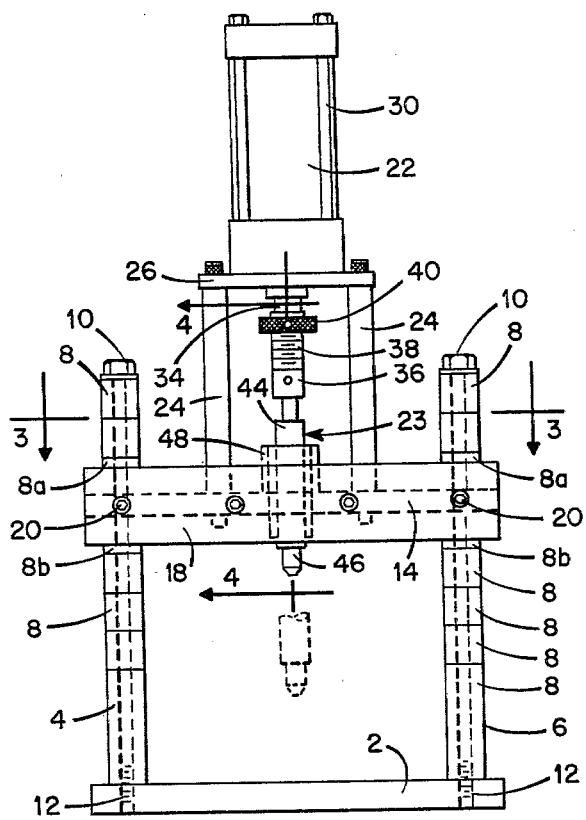
FIG. 1 is a side elevation of the press.
Figure 2:
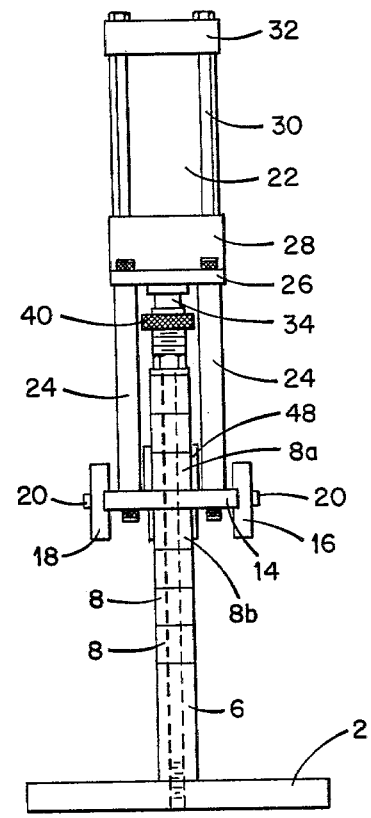
FIG. 2 is an end elevation of FIG. 1.

Referring first to FIGS. 1 and 2, the press comprises a base 2 preferably of steel and heavy enough to provide an adequate support for the work pieces that will be placed thereon.

Two vertical supporting columns 4 and 6 are mounted on base 2. The columns comprise a plurality of thick walled tubular spacers 8 of uniform diameter and equal length held together by long rods 10, the lower ends of which may be screwed into base 2 as at 12 and the upper ends having removable nuts or cap screws to permit easy disassembly of the spacers 8.

The columns 4 and 6 carry a strong cross bar in the form of a rigid plate 14 having holes therethrough spaced to receive the bolts 10. As can be seen in FIG. 2, plate 14 is positioned between adjacent spacers 8a and 8b. The vertical position of plate 14 can be coarsely adjusted by relocating it between any two selected spacers 8. When plate 14 is in the selected location, the bolts 10 are tightened to fix the plate in rigid and parallel relation with base 2.

To increase the rigidity of plate 14, a pair of longitudinally grooved ribs 16 and 18 are fastened to the sides of the plate by cap screws 20. Plate 14 is thus placed in a condition in which it is substantially immovable with respect to base 2 and fully able to support the operating mechanism about to be described.

The pin inserting means comprises a cylinder 22 with a punch and chuck unit 23 depending therefrom. The cylinder is mounted a substantial distance above plate 14 in the following manner. Four posts 24, fixed to plate 14 support a plate 26 which carries the cylinder 22 resting in a cylindrical member 28 attached to plate 26. Four tie rods 30 and cap 32 hold the cylinder 22 firmly in member 28.

The piston rod 34 of cylinder 22 extends downward through plate 26 and carries member 36 exteriorly threaded as at 38. An adjustable nut 40 for limiting the downward stroke of member 36 is mounted on threads 38.

Depending from member 36 is unit 23 previously referred to which comprises a cylindrical body 44 and a telescoping pin chuck 46. The chuck releaseably holds a pin which is to be inserted into a suitable hole in a work piece positioned thereunder. A punch 47 within the chuck behind the pin, is directly connected with the body 44 so that descent of the piston drives the pin into the hole as the telescoping chuck stops on engagement with the work piece.

The unit 23 is detachably secured to threaded member 36 so that alternative pin chucks sized to carry pins of different sizes may be put in operation.

The unit 23 extends vertically downward through a bushing 48 (see FIG. 4) which is located in a circular opening 49 in plate 14. The bushing is maintained in correct vertical position by engagement of shoulder 50 with plate 14. The lower cylindrical interior 52 of the bushing is sized to provide a close running fit for the body 44 so that the movement of the body and pin chuck follows a precise vertical path. The upper cylindrical interior 54 of the bushing is enlarged to receive freely therein the threaded member 36.

From the description thus far, it is apparent that when piston 34 of the cylinder 22 is actuated, the unit 23 will descend, guided by bushing 48. Downward movement is limited by engagement of nut 40 with the upper end of bushing 48. By adjustment of the position of nut 40 on the threads 38, the extent of downward movement of unit 23 can be precisely controlled.

Figure 4:
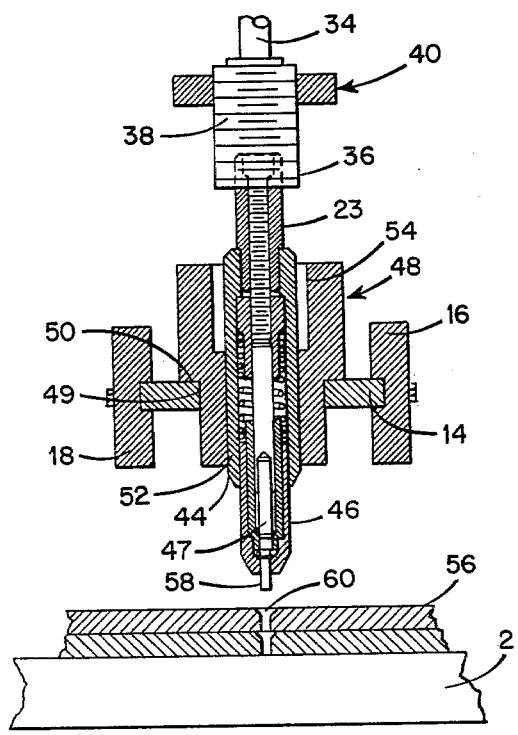
FIG. 4 is an enlarged vertical section taken on the line 4—4 of FIG. 1.
Figure 3:
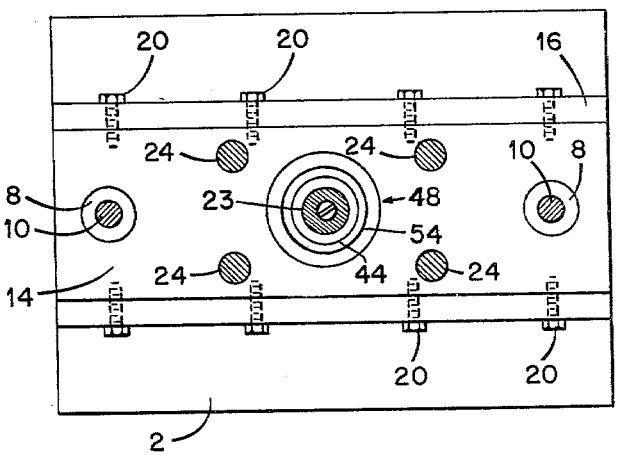
FIG. 3 is an enlarged horizontal section taken on the line 3—3 of FIG. 1.

In the operation of the press, the work piece 56 into which one or more pins are to be inserted, is placed on the base 2 as shown in FIG. 4. The vertical dimensions of the work pieces will vary from job to job so it is then necessary to make a coarse adjustment of plate 14 on the posts 4 and 6 so that the downward stroke of the piston 34 will be sufficient to enable the chuck and punch 47 function to drive the pin into the appropriate hole in the work piece.

The coarse adjustment as previously mentioned is easily accomplished by removing the nuts or cap screws from the upper ends of rods 10 whereby the spacers 8 can be removed to permit plate 14 to be placed between those spacers which will enable the chuck 46 to be located far enough above the work piece to permit finger insertion of a pin in the chuck but close enough to be within the stroke of the piston. The nuts or cap screws are then reapplied to the upper ends of rods 10 and set up tightly to place the superstructure in rigid condition.

The work piece is then accurately located on the base so that the hole into which a pin is to be inserted is exactly below the pin in the chuck. See FIG. 4 in which pin 58 is directly above hole 60 in work piece 56.

Then, according to the distance the pin is to be driven into the hole, the extent of the required downward movement of body 44 and the associated punch 47 can be determined. Nut 40 is then adjusted on threads 38 so that downward movement of the punch is limited to the exact required distance.

Operation of the press may then start. The operator places a pin 58 in the chuck 46. The fluid control on cylinder 22 is opened to drive piston 34 and the punch and chuck unit 23 down toward the work piece. Pin 58 engages hole 60 and begins to enter under the driving force of the punch 47 within the chuck. Downward movement of the chuck stops when the nose thereof engages the work piece but the pin punch 47 therein continues downward movement to force the pin further into the hole. Pin movement into the hole stops when nut 40 engages bushing 48 to stop the further downward movement of the pin punch.

The movement of piston 34 is then reversed to move the punch and chuck to upper rest position. The chuck may then be reloaded, the work piece moved to align another hole with the new pin, or another work piece is placed on base 2 and located to receive the next pin.

The aforedescribed operation is semi-automatic, requiring only the manual positioning of the pin in the chuck. Short runs on work pieces of different sizes can be performed speedily and with precision.

It is intended to cover all changes and modifications of the examples of the invention herein chosen for the purposes of the disclosure which do not constitute departures from the spirit and scope of the invention.

I claim:

1. In a machine for driving a pin into a hole of cooperating size in a work piece mounted on a base and in which the machine comprises a fluid cylinder with a piston for moving a pin chuck on the end thereof in rectilinear motion with respect to said base on which said cylinder is mounted, the means for mounting said cylinder on said base comprising a cylinder support and means for adjusting the distance of said support from said base in fixed increments which increments are not greater than the stroke of the said piston, said support comprising a plate and the means for adjusting the position of said plate comprising a plurality of posts mounted on said base, each post formed of tubular spacers held together by a rod passing therethrough with two adjacent spacers on each post clamping the said plate therebetween, and infinitely adjustable means attached to said piston adapted to engage an element fixed with respect to said support thereby to control the extent of the stroke of said piston and the chuck toward said base.

2. The construction set forth in claim 1, the said infinitely adjustable means comprising a screw threaded nut mounted on threads on said piston and the said element adapted to be engaged by said nut being a bushing mounted on said plate through which said piston passes.

3. A press for driving a pin into a hole of cooperating size in a work piece, said press comprising a flat base for supporting a work piece, a plurality of supporting posts connected to said base, each post comprised of a plurality of aligned tubular spacers, a horizontal plate (carried by said posts) gripped by adjacent spacers and held in parallel spaced relation to said base, said tubular spacers comprising means for coarsely adjusting the vertical position of said plate on said posts, a fluid cylinder mounted on said plate in vertical position, a piston extending vertically downward from said cylinder, a hole in said plate aligned with said piston, a pin driving unit attached to said piston, means associated with said plate for guiding said unit as it is moved by said piston up and down within said hole, and adjustable stop means movable axially with respect to said piston adapted to engage a stop fixed with respect to said plate to limit downward movement of said piston and said pin driving unit.

4. First and second means for controlling the extent of movement of a pin chuck mounted on the end of a fluid cylinder piston toward a work piece mounted on a base on which said cylinder is supported in fixed but changeable spaced relation to said base, said first means providing coarse adjustment and comprising a plate on which said cylinder is mounted, means for selectively locating said plate in one of a plurality of fixed positions above and parallel to said base thereby to determine the position of maximum travel of said piston and chuck toward said base, said means for selectively locating said plate comprising a plurality of posts mounted on said base, each said post comprised of a plurality of separable vertically aligned spacers, means attached to said base for clamping said spacers together, said plate being held in said selected location by being clamped between two adjacent spacers on each said post.

* * * * *